(12) United States Patent
Lee

(10) Patent No.: US 7,410,865 B2
(45) Date of Patent: Aug. 12, 2008

(54) METHOD FOR FABRICATING CAPACITOR OF SEMICONDUCTOR DEVICE

(75) Inventor: Soo Jae Lee, Icheon-shi (KR)

(73) Assignee: Hynix Semiconductor Inc., Icheon-shi (KR)

( * ) Notice: Subject to any disclaimer, the term of this patent is extended or adjusted under 35 U.S.C. 154(b) by 259 days.

(21) Appl. No.: 11/269,095

(22) Filed: Nov. 8, 2005

(65) Prior Publication Data
US 2007/0004166 A1    Jan. 4, 2007

(30) Foreign Application Priority Data
Jun. 30, 2005    (KR)    ............... 10-2005-0058774

(51) Int. Cl.
*H01L 21/8242*    (2006.01)
(52) U.S. Cl. ............. 438/253; 438/396; 438/756; 257/E21.648
(58) Field of Classification Search ........... 438/396, 438/756, 905, 253
See application file for complete search history.

(56) References Cited

U.S. PATENT DOCUMENTS

| 5,513,601 A | 5/1996 | Benson |
| 6,232,239 B1 | 5/2001 | Lim |
| 6,716,756 B2 | 4/2004 | Kang |
| 2003/0190808 A1 | 10/2003 | Kim et al. ............ 438/689 |
| 2004/0033698 A1 | 2/2004 | Lee et al. ............ 438/758 |
| 2005/0191856 A1* | 9/2005 | Torek et al. ............ 438/689 |
| 2005/0202645 A1* | 9/2005 | Kim et al. ............ 438/386 |

FOREIGN PATENT DOCUMENTS

| JP | 04-232443 | 8/1992 |
| KR | 100252223 B1 | 1/2000 |
| KR | 1020040059849 A | 7/2004 |

* cited by examiner

*Primary Examiner*—Thanh Nguyen
(74) *Attorney, Agent, or Firm*—Marshall, Gerstein & Borun LLP

(57) ABSTRACT

Disclosed herein is a method for fabricating a capacitor of a semiconductor device. The method comprises the steps of forming an interlayer insulating film on a semiconductor substrate, forming contact plugs connected to the semiconductor substrate though the interlayer insulating film, forming a first storage node oxide film include a PSG film on the contact plugs, cleaning the semiconductor substrate on which the first storage node oxide film include a PSG film is formed, using isopropyl alcohol (IPA), to remove water-soluble compounds, and forming a second storage node oxide film on the first storage node oxide film.

3 Claims, 6 Drawing Sheets

(a) (b)

FIG. 11
FIG. 12
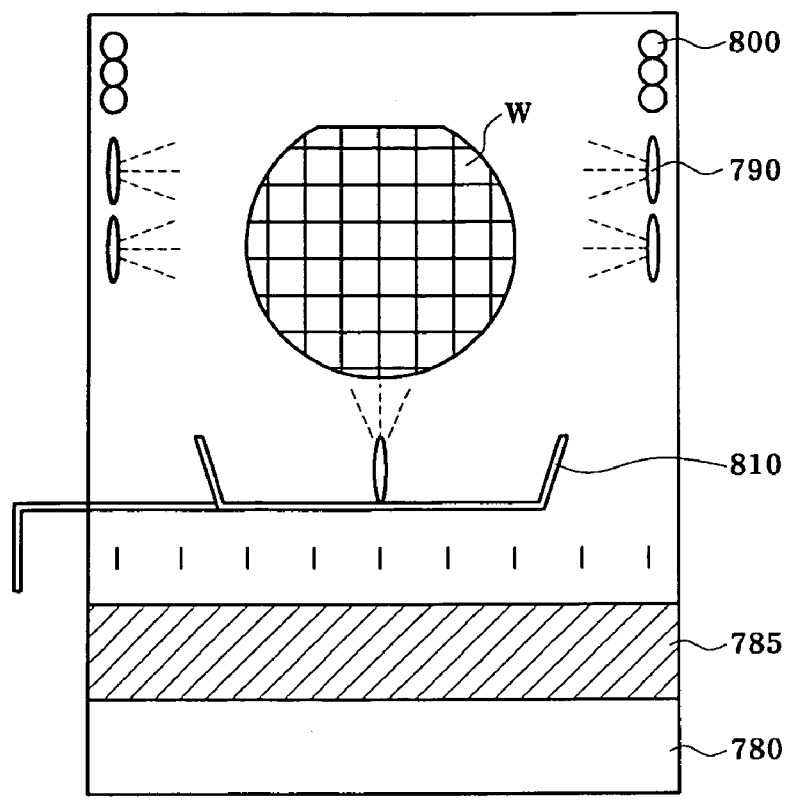
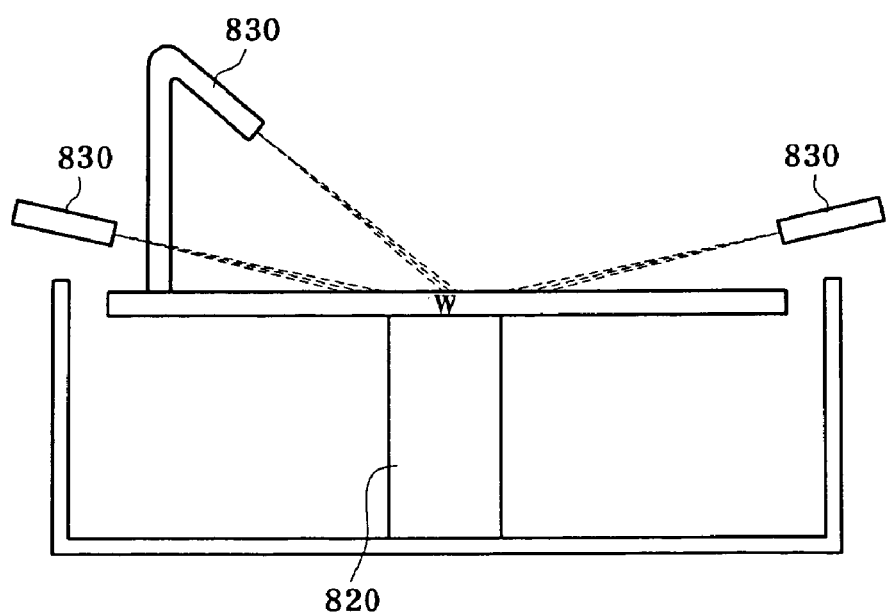

METHOD FOR FABRICATING CAPACITOR OF SEMICONDUCTOR DEVICE

BACKGROUND OF THE INVENTION

1. Field of the Invention

The present invention relates to a method for fabricating a semiconductor device, and more particularly to a method for fabricating a capacitor of a semiconductor device with improved characteristics by removing water-soluble oxides formed on the storage node oxide film.

2. Description of the Related Art

In recent years, high integration of semiconductor memory devices has resulted in a decrease in the design rule of the devices and a reduction in the area occupied by capacitors. Thus, many difficulties have been encountered in ensuring sufficient capacity of capacitors. In an attempt to solve these difficulties, a number of studies are being undertaken to increase the height of storage nodes, for example, the step of storage node oxide films. However, a major limitation in increasing the step of storage node oxide films is an insufficient process margin. Another attempt to increase the capacity of capacitors is the use of both inner and outer sides of cylindrical capacitors fabricated by removal of storage node oxide films. In the case where storage node oxide films are removed by wet etching, however, capacitors may fall down or become uprooted. To solve the problems caused by wet etching, there have been suggestions to form storage node oxide films into dual oxide films.

FIG. 1 is a view illustrating a capacitor of a semiconductor device according to the prior art.

Referring to FIG. 1, first, a transistor and a bit line (not shown) are formed on a semiconductor substrate 110, and an interlayer insulating film 110 is formed thereon. Contact plugs are formed in such a manner that they are connected to active regions of the semiconductor substrate 110 through the interlayer insulating film 110. The interlayer insulating film 110 may be composed of a plasma enhanced TEOS (PE-TEOS) film, and the contact plugs 120 may be formed by embedding a conductive material in contact holes. Subsequently, a storage node oxide film 130 is formed on the interlayer insulating film 110 and the contact plugs 120.

The storage node oxide film 130 is selectively etched in such a way that the contact plugs 120 are exposed to form capacitor holes. A material for a storage node electrode is embedded in the capacitor holes, and flattened by etchback, chemical mechanical polishing or the like to form a storage node electrode 140.

On the other hand, the storage node oxide film 130 may be composed of a single film of an undoped silicate glass (USG), high-density plasma (HDP) or TEOS oxide film. Alternatively, the storage node oxide film 130 may be composed of a double film consisting of films having different wet etching characteristics, for example, a double film consisting of a first capacitor sacrificial insulating film composed of a phosphorus silicate glass (PSG) oxide film and a PETEOS film formed on the PSG film.

If a PSG film is used as the storage node oxide film 130, phosphorus (P), which is an impurity present in the PSG film, is continuously diffused out according to the changes in the concentration of phosphorus (P) in a thin film and increasing exposure time in air after formation of the PSG film, and reacts with moisture present in the air to form water-soluble oxides on the surface of the PSG film.

FIG. 2 is a graph showing changes in the composition of a thin film as a function of time after formation of the storage node oxide film in accordance with the prior art.

FIGS. 3a and 3b show the formation of water-soluble oxides on the surface of the PSG film with increasing the exposure time in the air after formation of the storage node oxide film in accordance with the prior art.

FIGS. 4 to 6 are views explaining problems arising due to the presence of the water-soluble oxides shown in FIG. 3.

Referring to FIG. 2, when a PSG film is used to form a storage node oxide film by the prior art, the concentration of phosphorus (P) that can be diffused out in a thin film increases with the passage of time after formation of the PSG film. The diffused-out phosphorus (P) is not observed in the initial stage of the formation of the PSG film (FIG. 3a), but reacts with moisture present in air with the passage of time to form water-soluble oxides 300 on the surface of the PSG film.

In the formation of a multiple thin film consisting of films having different wet etching selectivity characteristics, the water-soluble oxides 300 have a considerably different wet etching selectivity from that of a normal interface between the PSG film and a subsequent thin film. As a result, tunneling 400 takes place to form storage node bridges, as shown in FIG. 4. Referring to FIG. 5, steps 500 caused by the water-soluble compounds induce formation of serious steps in the subsequent processing after deposition, causing defects upon pattern formation.

To prevent the formation of the water-soluble compounds, subsequent processing is performed immediately after formation of the PSG film to minimize the exposure time in air, or a wafer exposed to ambient air for a long time after formation of the PSG film is subjected to high-pressure cleaning using deionized water to inhibit the formation of water-soluble compounds. However, the former is unsuitable to fabricate capacitors on an industrial scale. The latter is a process wherein water-soluble compounds are removed using water supplied by means of simple rotation instead of thermal treatment upon wafer drying. A problem of this process is that defect sources 600 are left on the wafer edges with the passage of time, as shown in FIG. 6.

SUMMARY OF THE INVENTION

It is an object of the present invention to provide a method for fabricating a capacitor of a semiconductor device comprising removing water-soluble compounds formed after formation of a storage node oxide film, thereby solving various problems arising due to the presence of the water-soluble compounds.

In accordance with an aspect of the present invention for achieving the above object, there is provided a method for fabricating a capacitor of a semiconductor device, comprising the steps of: forming an interlayer insulating film on a semiconductor substrate; forming contact plugs connected to the semiconductor substrate through the interlayer insulating film; forming a first storage node oxide film including a PSG film on the contact plugs; cleaning the semiconductor substrate on which the first storage node oxide film is formed, using isopropyl alcohol (IPA), thereby removing water-soluble compounds; and forming a second storage node oxide film on the first storage node oxide film.

In the step of cleaning with isopropyl alcohol, reaction products between the isopropyl alcohol and the water-soluble compounds are removed by gravity.

Alternatively, in the step of cleaning with isopropyl alcohol, reaction products between the isopropyl alcohol and the water-soluble compounds are removed using a rotational force.

BRIEF DESCRIPTION OF THE DRAWINGS

The above and other objects, features and other advantages of the present invention will be more clearly understood from the following detailed description taken in conjunction with the accompanying drawings, in which:

FIGS. 11 and 12 are views illustrating cleaning apparatuses for removing water-soluble compounds formed after formation of a storage node oxide film in accordance with the present invention.

DESCRIPTION OF THE PREFERRED EMBODIMENTS

Figure 1:
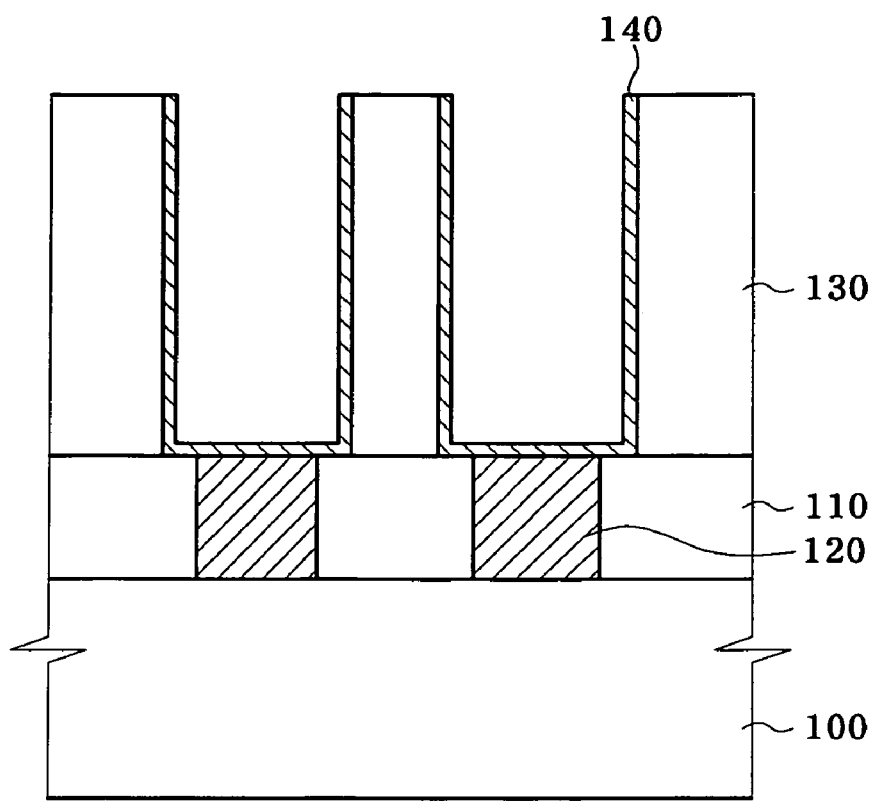
FIG. 1 is a view illustrating a capacitor of a semiconductor device according to the prior art.
Figure 2:
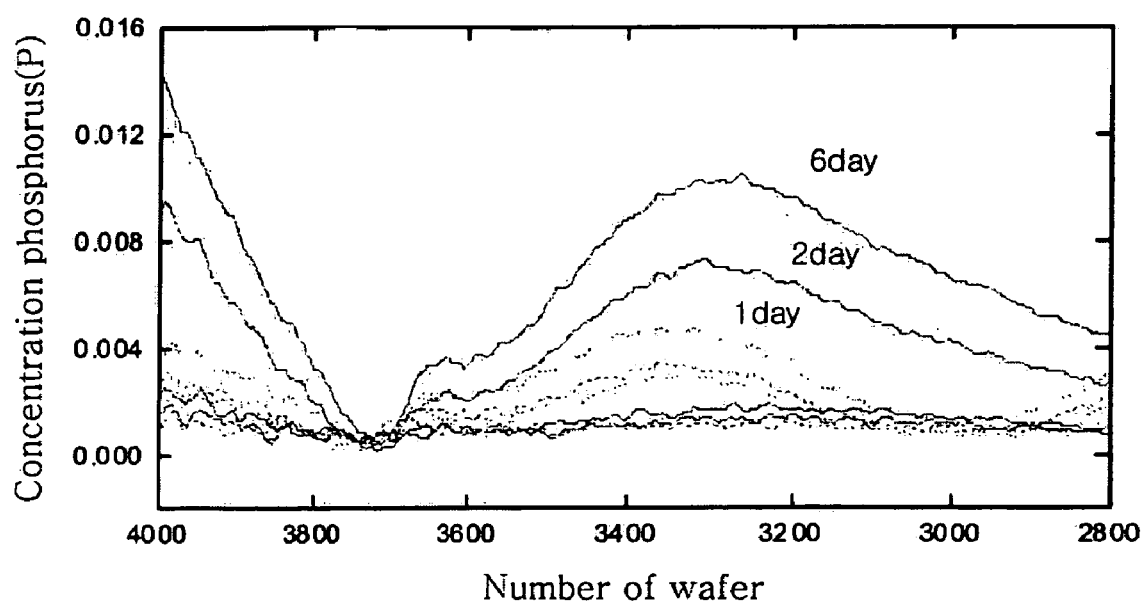
FIG. 2 is a graph showing changes in the concentration of phosphorus (P) in a thin film as a function of time after formation of a storage node oxide film in accordance with the prior art.

Preferred embodiments of the present invention will now be described in detail with reference to the accompanying drawings. However, these embodiments can be modified and are not to be construed as limiting the scope of the invention. For the purpose of clarity, the thickness of the layers and regions shown in the drawings is enlarged. The same or similar elements are designated by the same reference numerals.

FIGS. 7 to 10 are views illustrating the procedure of a method for fabricating a capacitor of a semiconductor device according to one embodiment of the present invention.

Figure 7:
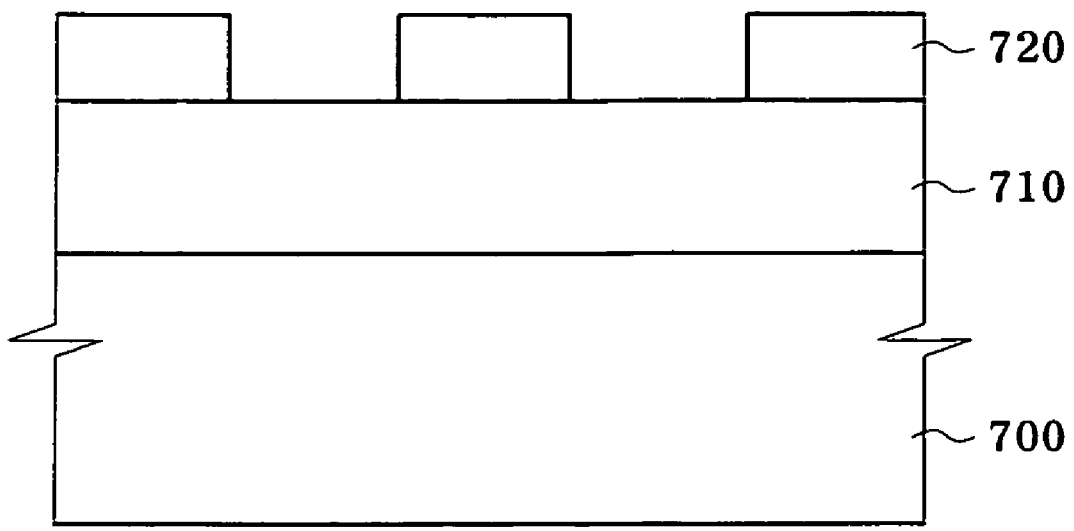
FIGS. 7 to 10 are views illustrating the procedure of a method for fabricating a capacitor of a semiconductor device according to the present invention.

Referring to FIG. 7, a semiconductor circuit, including a transistor, a bit line, etc., is formed on a semiconductor substrate 700, and an interlayer insulating film 710 is formed thereon. Next, a photosensitive film is applied to the interlayer insulating film 710, and subjected to photolithography and etching to form a photosensitive pattern 720 defining regions for contact plugs.

Figure 8:
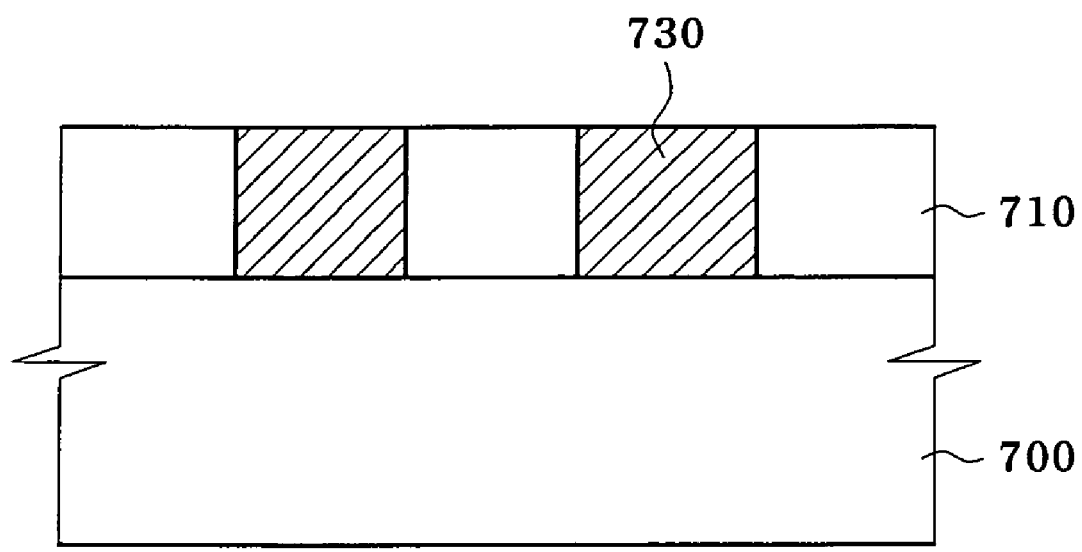

Referring to FIG. 8, the interlayer insulating film 710 is etched using the photosensitive film 720 as an etch mask to form contact holes through which predetermined regions of the surface of the semiconductor substrate 700 are exposed. Thereafter, the photosensitive film pattern 720 is removed. Next, after a conductive film is formed over the entire surface of the interlayer insulating film 710, including the contact holes, etchbacking is performed to form contact plugs 730 embedded in the contact holes. The interlayer insulating film 710 may include a plasma enhanced TEOS (PETEOS) film, and the contact plugs 730 may be formed of a conductive material, such as poly-silicon.

Figure 3:
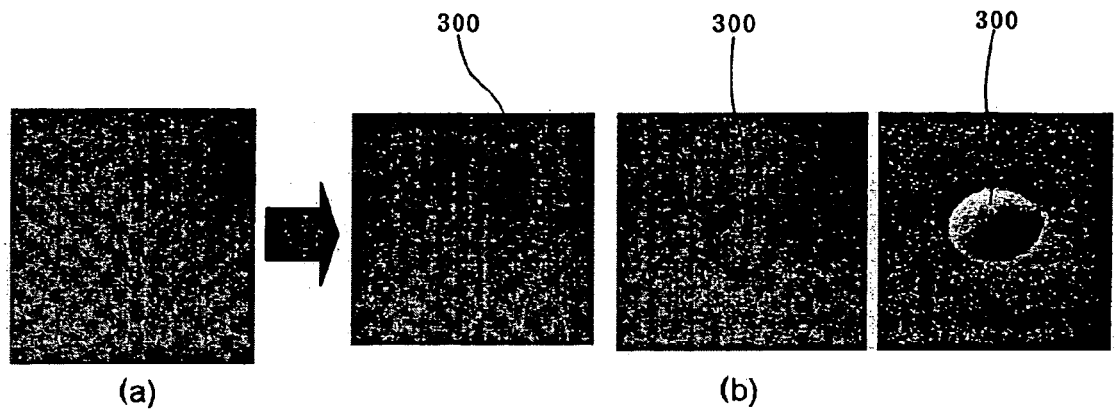
FIGS. 3a and 3b show the formation of water-soluble oxides on the surface of a PSG film with increasing the exposure time in air after formation of a storage node oxide film in accordance with the prior art.
Figure 4:
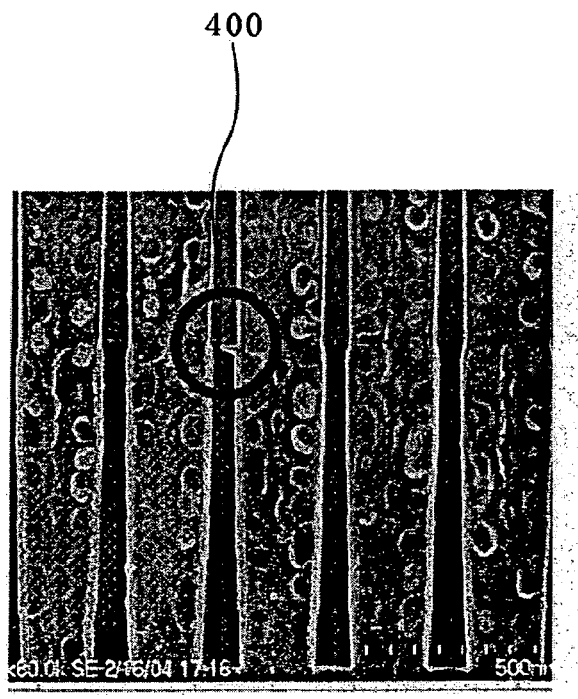
FIGS. 4 to 6 are views explaining problems arising due to the presence of water-soluble oxides.
Figure 5:
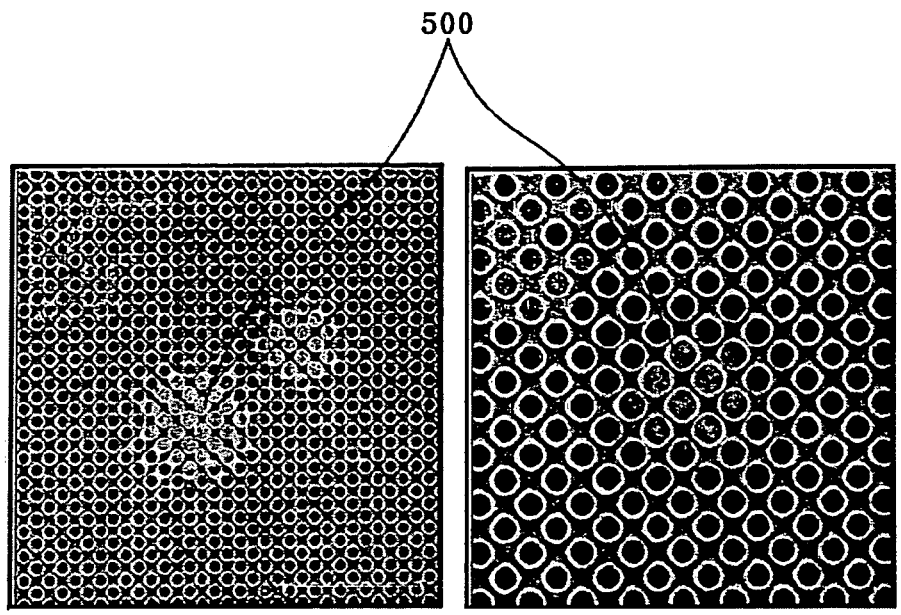
Figure 6:
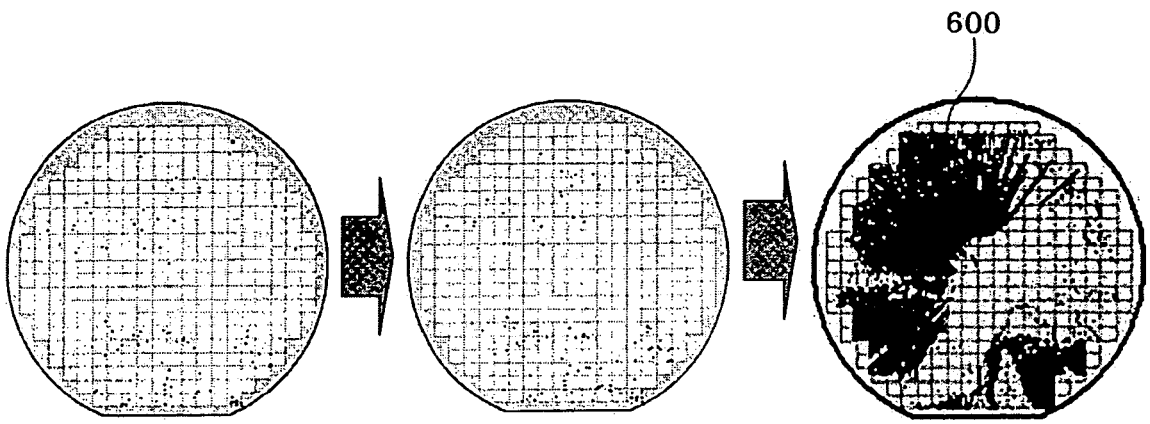
Figure 9:
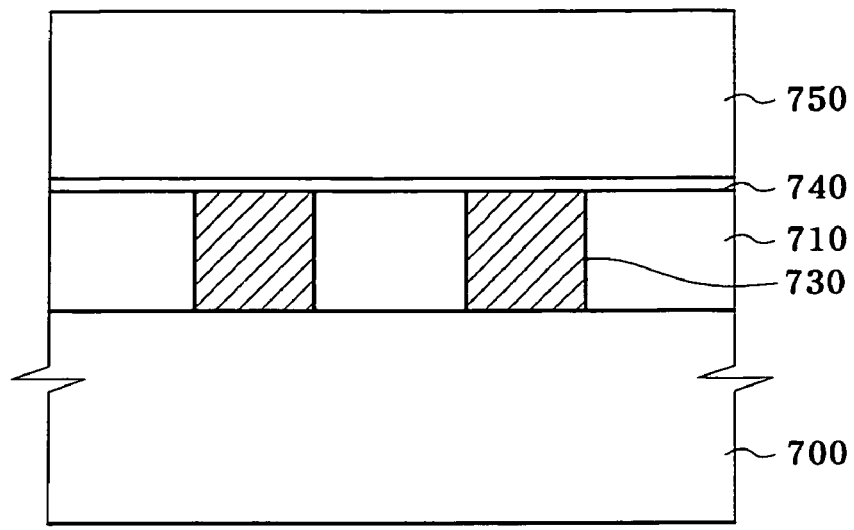

Referring to FIG. 9, an etch stopping film 740 and a first storage node oxide film 750 are sequentially formed on the interlayer insulating film 710 and the contact plugs 730. The etch stopping film 740 acts as a barrier film during etching for forming contact holes for a lower electrode, and can include a nitride film using chemical vapor deposition (CVD). In addition, the first storage node oxide film 750 may include a phosphorus silicate glass (PSG) oxide film. In the case where a PSG oxide film is used as the first storage node oxide film 750, phosphorus (P) is diffused out from the PSG film according to the increased exposure time in air after formation of the PSG oxide film, and reacts with moisture present in air to form water-soluble oxides 300, such as phosphoric acid compounds ($P_2O_4$, $P_2O_5$) and phosphoric acid anhydrides ($P_4O_{10}$) (see, FIG. 3), which show abnormal steps and abnormal wet etching selectivity characteristics, as in the prior art.

In view of these problems, the semiconductor substrate 700 on which the storage node oxide film 750 include a PSG oxide film is formed and cleaned, using isopropyl alcohol (IPA), thereby removing water-soluble compounds. To this end, the semiconductor substrate 700 on which the first storage node oxide film 750 is formed is loaded on a dry cleaning apparatus and is supported in the apparatus.

FIG. 11 is a view illustrating a dry cleaning apparatus for removing water-soluble compounds formed after formation of the storage node oxide film in accordance with the present invention.

With reference to FIG. 11, the dry cleaning apparatus comprises a loader for supporting a wafer (w), a heater 780 positioned at a lower portion of the cleaning apparatus to heat the cleaning apparatus, spray ports 790 positioned at both sides and a lower side of the wafer (w) to spray isopropyl alcohol (IPA) vapor on the wafer (w), a cooling coil 800 positioned at an uppermost portion of the cleaning apparatus to cool the isopropyl alcohol (IPA) vapor, and a gutter 810 positioned below the wafer (w) to discharge the isopropyl alcohol (IPA) reacted or unreacted with impurities.

A method for cleaning a wafer using the cleaning apparatus will be explained below.

First, a wafer (w) is loaded on the cleaning apparatus and is supported in the apparatus. Liquid isopropyl alcohol (IPA) is supplied to the cleaning apparatus. The isopropyl alcohol is vaporized by the action of a heater 780 positioned at a lower portion of the cleaning apparatus to heat the cleaning apparatus, and sprayed on the wafer (w) through spray ports 790 positioned at both sides and a lower side of the wafer (w). The isopropyl alcohol (IPA) supplied to the wafer (w) reacts with water-soluble compounds present on the wafer (w) surface, condensed, and drops on the bottom of the cleaning apparatus by gravity. A portion of the isopropyl alcohol (IPA) unreacted with water-soluble compounds is condensed by a cooling coil 800 positioned at an upper side of the spray ports 790, and drop on the bottom of the cleaning apparatus. The isopropyl alcohol (IPA) reacted or unreacted with water-soluble compounds is discharged to the outside by a gutter 810 positioned below the wafer (w), and purified at a part under the heater 780 to remove the water-soluble compounds. The purified isopropyl alcohol (IPA) is again supplied to the cleaning apparatus.

FIG. 12 a view illustrating another cleaning apparatus for removing water-soluble compounds formed after formation of the storage node oxide film in accordance with the present invention.

With reference to FIG. 12, the cleaning apparatus for removing water-soluble compounds comprises a vacuum chuck 720 for evacuating the cleaning apparatus while supporting a wafer (w), and nozzles 830 positioned at an upper side and both sides of the wafer (w) to supply a cleaning solution. The cleaning apparatus can be rotated.

A method for cleaning a wafer using the cleaning apparatus will be explained below.

First, a wafer (w) is loaded on the cleaning apparatus in a rotating state and supported in the cleaning apparatus. The inner space of the cleaning apparatus is evacuated by the action of a vacuum chuck 820. Thereafter, liquid isopropyl alcohol (IPA) is supplied to the cleaning apparatus. The isopropyl alcohol (IPA) is supplied to the wafer (w) for a particular period of time through nozzles 830 positioned at both the upper side and lateral sides of the wafer (w). The liquid isopropyl alcohol (IPA) supplied to the wafer (w) reacts with water-soluble compounds present on the wafer (w). Subsequently, the cleaning apparatus is rotated to evaporate the liquid isopropyl alcohol (IPA). The water-soluble compounds are removed by using a rotational force of the cleaning apparatus. De-ionized water is used to remove water-soluble compounds from a wafer (w) according to a conventional cleaning apparatus. In contrast, since isopropyl alcohol (IPA), which is more reactive than the water-soluble compounds, is used in the present invention, the water-soluble compounds can be efficiently removed.

Figure 10:
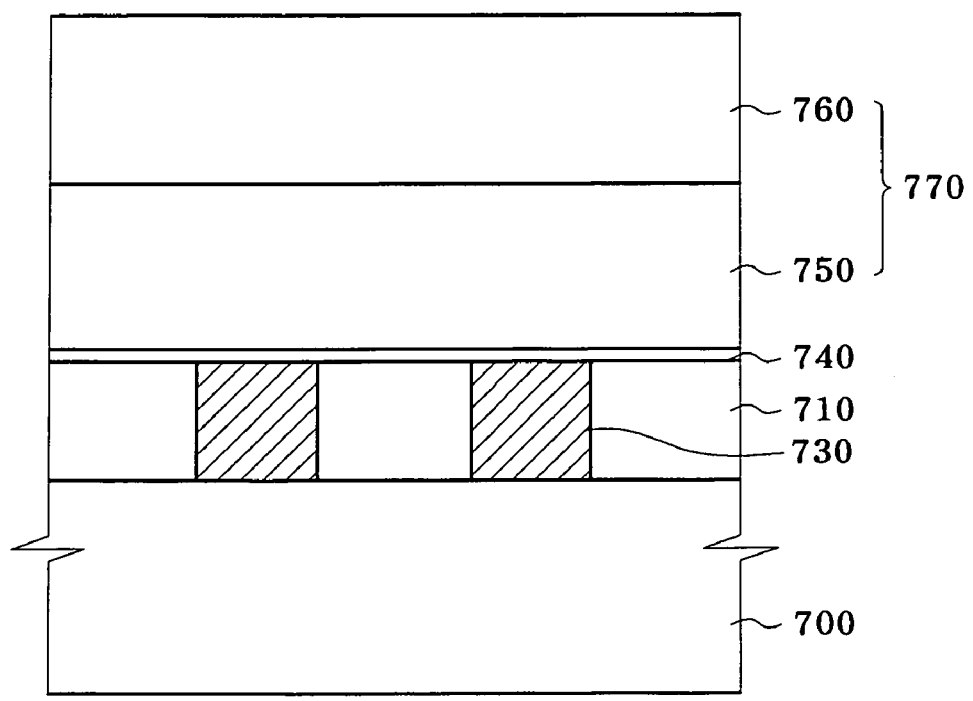

Referring to FIG. 10, a second storage node oxide film 760 is formed on the first storage node oxide film 750, which has been already cleaned using isopropyl alcohol (IPA), to form a sacrificial insulating film 770 for a capacitor having a multilayer structure. The second storage node oxide film 760 may include a plasma enhanced TEOS (PETEOS) film.

Although not shown in the figure, capacitor holes are formed in some regions of the sacrificial insulating film for a capacitor in such a manner that the contact plugs are exposed, and are treated by particular processes to fabricate a capacitor comprising a lower electrode, a dielectric film and an upper electrode.

The removal of water-soluble compounds formed on the interface of the PSG film by dry cleaning enables prevention of abnormal steps and abnormal wet etching selectivity characteristics arising due to the presence of water-soluble compounds obtained from a reaction between phosphorus impurities diffused out form the PSG film and moisture present in air.

As apparent from the foregoing, according to the method of the present invention, water-soluble compounds formed after formation of a storage node oxide film can be removed, enabling prevention of abnormal steps and abnormal wet etching selectivity characteristics arising due to the presence of the water-soluble compounds. In addition, limitations to the time intervals between formation of a PSG film and successive processes can be avoided.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device, comprising:
    forming an interlayer insulating film on a semiconductor substrate;
    forming contact plugs connected to the semiconductor substrate through the interlayer insulating film;
    forming a first storage node oxide film including a phosphorous silicate glass (PSG) film on the contact plugs;
    cleaning the semiconductor substrate on which the first storage node oxide film is formed with isopropyl alcohol (IPA), thereby removing water-soluble compounds formed by a reaction between moisture and out-diffused phosphorous from the PSG film; and
    forming a second storage node oxide film on the first storage node oxide film after cleaning the semiconductor substrate with isopropyl alcohol.

2. The method according to claim 1, wherein, in cleaning with isopropyl alcohol, reaction products between the isopropyl alcohol and the water-soluble compounds are removed by gravity.

3. The method according to claim 1, wherein, in cleaning with isopropyl alcohol, reaction products between the isopropyl alcohol and the water-soluble compounds are removed by using a rotational force.

\* \* \* \* \*